(12) United States Patent
Takaya

(10) Patent No.: US 10,396,305 B2
(45) Date of Patent: Aug. 27, 2019

(54) ORGANIC EL DEVICE, AND DISPLAY APPARATUS AND LIGHTING APPARATUS USING THE SAME

(71) Applicant: CANON KABUSHIKI KAISHA, Tokyo (JP)

(72) Inventor: Itaru Takaya, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/821,558

(22) Filed: Nov. 22, 2017

(65) Prior Publication Data

US 2018/0151823 A1 May 31, 2018

(30) Foreign Application Priority Data

Nov. 29, 2016 (JP) .................. 2016-230807
Nov. 7, 2017 (JP) .................. 2017-214421

(51) Int. Cl.
| | | |
|---|---|---|
| *H01L 51/50* | (2006.01) | |
| *H01L 51/52* | (2006.01) | |
| *H01L 27/32* | (2006.01) | |
| *H05B 33/08* | (2006.01) | |
| *G02B 5/20* | (2006.01) | |
| *H01L 51/00* | (2006.01) | |

(52) U.S. Cl.
CPC ........ *H01L 51/5036* (2013.01); *H01L 27/322* (2013.01); *H01L 27/3244* (2013.01); *H01L 51/504* (2013.01); *H01L 51/5206* (2013.01); *H01L 51/5221* (2013.01); *H01L 51/5265* (2013.01); *G02B 5/201* (2013.01); *H01L 27/3211* (2013.01); *H01L 51/006* (2013.01); *H01L 51/0054* (2013.01); *H01L 51/0058* (2013.01); *H01L 51/0072* (2013.01); *H01L 51/5004* (2013.01); *H01L 51/5092* (2013.01); *H01L 2251/5315* (2013.01); *H01L 2251/5392* (2013.01); *H01L 2251/552* (2013.01); *H01L 2251/558* (2013.01); *H05B 33/0896* (2013.01)

(58) Field of Classification Search
None
See application file for complete search history.

(56) References Cited

U.S. PATENT DOCUMENTS

| | | | | |
|---|---|---|---|---|
| 9,685,625 | B2* | 6/2017 | Song | ................. H01L 51/5096 |
| 9,722,200 | B2* | 8/2017 | Ma | ..................... H01L 51/504 |
| 9,917,281 | B2* | 3/2018 | Ma | ..................... H01L 51/5004 |
| 2006/0232203 | A1* | 10/2006 | Noda | .................. H01L 51/5203 |
| | | | | 313/506 |

(Continued)

FOREIGN PATENT DOCUMENTS

JP 2014022205 A 2/2014

*Primary Examiner* — Michael Lebentritt
(74) *Attorney, Agent, or Firm* — Canon U.S.A., Inc. IP Division

(57) ABSTRACT

An organic EL device includes a substrate, a reflection electrode, an organic compound layer and a light extraction electrode in this order. The organic compound layer includes a first light-emitting layer which is electron trapping type light-emitting layer and a second light-emitting layer disposed between the reflection electrode and the first light-emitting layer. An optical distance between the reflection electrode and the first light-emitting layer is a distance of constructive interference for the light of the first light-emitting layer.

20 Claims, 2 Drawing Sheets

(56) References Cited

U.S. PATENT DOCUMENTS

| | | | | |
|---|---|---|---|---|
| 2008/0084159 A1* | 4/2008 | Fery | H01L 25/048 | 313/504 |
| 2008/0185954 A1* | 8/2008 | Fukuda | H01L 27/3211 | 313/483 |
| 2008/0258609 A1* | 10/2008 | Nakamura | H01L 51/5265 | 313/504 |
| 2009/0096359 A1* | 4/2009 | Lee | H01L 51/5036 | 313/504 |
| 2009/0146560 A1* | 6/2009 | Kim | H01L 51/5036 | 313/506 |
| 2010/0237335 A1* | 9/2010 | Takaya | H01L 27/3211 | 257/40 |
| 2011/0073885 A1* | 3/2011 | Kim | H01L 27/3211 | 257/89 |
| 2011/0114981 A1* | 5/2011 | Higaki | H01L 51/5265 | 257/98 |
| 2011/0140597 A1* | 6/2011 | Lee | H01L 51/5262 | 313/506 |
| 2011/0193116 A1* | 8/2011 | Fukuda | H01L 51/5271 | 257/98 |
| 2013/0048968 A1* | 2/2013 | Takaya | H01L 51/504 | 257/40 |
| 2013/0048986 A1* | 2/2013 | Lee | H01L 51/5265 | 257/52 |
| 2013/0056717 A1* | 3/2013 | Ishihara | H01L 51/5265 | 257/40 |
| 2013/0153871 A1* | 6/2013 | Ma | H01L 51/504 | 257/40 |
| 2013/0193419 A1* | 8/2013 | Mizuno | H01L 51/5271 | 257/40 |
| 2014/0027744 A1* | 1/2014 | Yoshida | H01L 51/0072 | 257/40 |
| 2014/0167014 A1* | 6/2014 | Liping | C09K 11/06 | 257/40 |
| 2014/0183480 A1* | 7/2014 | Lee | H01L 51/5012 | 257/40 |
| 2015/0280161 A1* | 10/2015 | Song | H01L 51/504 | 257/40 |
| 2015/0318334 A1* | 11/2015 | Kim | H01L 27/3213 | 257/40 |
| 2015/0318507 A1* | 11/2015 | Song | H01L 51/5206 | 257/40 |
| 2016/0155988 A1* | 6/2016 | Kuroki | H01L 51/0097 | 257/40 |
| 2016/0222165 A1* | 8/2016 | Wakita | G02B 5/20 | |
| 2016/0300888 A1* | 10/2016 | Wang | H01L 27/3213 | |
| 2017/0033317 A1* | 2/2017 | Kajimoto | H01L 51/5044 | |
| 2017/0263877 A1* | 9/2017 | Song | H01L 51/504 | |

\* cited by examiner

ORGANIC EL DEVICE, AND DISPLAY APPARATUS AND LIGHTING APPARATUS USING THE SAME

BACKGROUND

Field of the Disclosure

The present disclosure relates to an organic electroluminescent (EL) device that emits light by passing a current through an organic light-emitting layer sandwiched between a pair of electrodes. In particular, the present disclosure relates to a top emission organic EL device, and a display apparatus and a lighting apparatus using the top emission organic EL device.

Description of the Related Art

In recent years, self-emitting devices designed for flat panels have received attention. Examples of the self-emitting devices include plasma light-emitting display devices, field emission devices, and EL devices. In particular, the organic EL devices have been used for, in addition to white lighting apparatuses, full-color display apparatuses such as monitors of televisions and smartphones and viewfinders of cameras.

A full-color display apparatus is produced using an organic EL device by the following two methods. In one method, light-emitting layers having different emission colors are allocated to pixels (devices). In another method, a white organic EL device including a white-light-emitting layer is provided and color filters of different colors are allocated to pixels. In the latter method that uses a white-light-emitting layer, white light is often emitted by mixing colors using two or more luminescent materials.

The luminescent materials for the white organic EL device are two light-emitting dopant materials of yellow and blue or three light-emitting dopant materials of red, green, and blue. In the case where three light-emitting dopant materials of red, green, and blue are used, for example, a red-light-emitting layer, a green-light-emitting layer, and a blue-light-emitting layer are stacked, or a red/green-light-emitting layer containing both a red-light-emitting dopant and a green-light-emitting dopant and a blue-light-emitting layer containing a blue-light-emitting dopant are stacked.

Japanese Patent Laid-Open No. 2014-22205 (hereinafter referred to as Patent Document 1) discloses a white organic EL device in which a red/green-light-emitting layer and a blue-light-emitting layer are stacked. In the white organic EL device in Patent Document 1, the blue-light-emitting layer is caused to have hole transporting properties by setting the difference in LUMO energy between a host material and a dopant material in the blue-light-emitting layer disposed close to a cathode so that the difference in LUMO energy is larger than the difference in HOMO energy. Thus, the durability is improved. In this case, since the blue-light-emitting layer has hole transporting properties, electrons are trapped in the blue-light-emitting layer. Therefore, by stacking the blue-light-emitting layer on the side closer to the cathode, only electrons that have not been trapped in the blue-light-emitting layer conduct to the red/green-light-emitting layer. On the other hand, the red/green-light-emitting layer is a typically used hole trapping layer and is formed on the anode side. Therefore, holes are trapped in the red/green-light-emitting layer, and only holes that have not been trapped conduct to the blue-light-emitting layer. Thus, when holes reach the blue-light-emitting layer in which electrons are trapped, light is emitted. When electrons reach the red/green-light-emitting layer in which holes are trapped, light is emitted.

In general, an organic EL device includes a hole injection layer or a hole transport layer between an anode and a light-emitting layer and also includes an electron injection layer or an electron transport layer between a cathode and the light-emitting layer. In a top emission organic EL device in which light is extracted from the side opposite to a substrate, generally, an anode is disposed on the substrate side and a cathode is disposed on the light extraction side.

In the top emission organic EL device, an electrode on the light extraction side is formed by subjecting an optically transparent conductive material such as ITO to sputter-deposition. In the formation, however, a member constituting an upper surface is damaged, which increases a light-emitting voltage applied to a device to achieve a desired light emission amount. The damage during the sputter-deposition for the electrode is higher in a hole transporting material for the hole injection layer or the hole transport layer than in an electron transporting material for the electron injection layer or the electron transport layer. Therefore, a cathode is particularly disposed on the light extraction side.

Lithium fluoride is widely used as an electron injecting material contained in an electron injection layer disposed in contact with a cathode. Lithium fluoride is reduced by depositing aluminum or the like thereon and thus exhibits an electron injection function. When a cathode is disposed on the substrate side, the cathode is formed, the electron injection layer is formed, and then aluminum or the like is deposited. Therefore, lithium fluoride cannot be used in a structure in which an electron injection layer or an electron transport layer is formed after the formation of the cathode. However, when a cathode is disposed on the light extraction side, the cathode is formed after the formation of the electron injection layer or the electron transport layer, that is, the cathode is formed after the formation of a deposited film of aluminum or the like, which poses no problem. Furthermore, since the upper surface during the sputter-deposition for the cathode is a deposited film of aluminum or the like, the damage to the electron injection layer or the electron transport layer is suppressed.

Therefore, in known top emission white organic EL devices, the cathode is generally disposed on the light extraction side. However, if a blue-light-emitting layer and a red/green-light-emitting layer are stacked and the blue-light-emitting layer is disposed on the cathode side as disclosed in Patent Document 1, the interference effect of light emission is not produced.

A typical top emission white organic EL device including a reflection electrode serving as an anode, a hole transport layer, a red/green-light-emitting layer, a blue-light-emitting layer, an electron transport layer, and a light extraction electrode serving as a cathode in this order from the substrate will be described.

When the optical distance from the reflection surface of the reflection electrode to the blue-light-emitting layer is set to $\lambda/4$ or the like so that the interference effect is produced, the optical distance from the reflection surface of the reflection electrode to the red/green-light-emitting layer is much shorter than $\lambda/4$ because the light emission wavelength of red/green light is longer than that of blue light, and thus the interference effect is not produced. On the other hand, when the optical distance from the reflection surface of the reflection electrode to the red/green-light-emitting layer is set to $\lambda/4$ or the like so that the interference effect is produced, the optical distance from the reflection surface of the reflection electrode to the blue-light-emitting layer is much longer than $\lambda/4$, and thus the interference effect of blue light emission is not produced.

As described above, if a hole transporting blue-light-emitting layer is used in the typical top emission white organic EL device, it is difficult to produce both the interference effect of blue light emission and the interference effect of red/green light emission, which unfavorably increases the power consumption.

Furthermore, if the optical distance from the reflection surface of the reflection electrode to the light-emitting layer is set to $\lambda/4$ and also the optical distance from the light-emitting layer to the light extraction electrode is set to $\lambda/4$, the entire organic compound layer has an excessively small thickness, which causes short circuits and leakage. If the optical distance from the light-emitting layer to the light extraction electrode is set to about $3\lambda/4$ to suppress short circuits and leakage, the electron transport layer has a large thickness, which increases the light-emitting voltage.

Moreover, the light extraction electrode can be formed of a transparent metal oxide such as ITO without using a metal thin film formed of Ag, MgAg, or the like, and the optical distance from the light-emitting layer to the light extraction electrode can be set to about $2\lambda/4$. However, this reduces the interference effect and poses another problem in that the blue color purity degrades.

SUMMARY

The present disclosure provides a top emission organic EL device including a hole transporting blue-light-emitting layer. In the top emission organic EL device, both the interference effect of blue light emission and the interference effect of red and green light emission are produced and the light-emitting voltage is decreased, thereby reducing the power consumption and improving the durability.

An organic EL device according to an aspect of the present disclosure includes, in the following order, a substrate, a reflection electrode, an organic compound layer, and a light extraction electrode. The reflection electrode serves as a cathode and the light extraction electrode serves as an anode. The organic compound layer includes a first light-emitting layer which is electron trapping type and a second light-emitting layer disposed between the first light-emitting layer and the light extraction electrode. The first light-emitting layer emits blue light and the second light-emitting layer emits light whose wavelength is longer than a wavelength of the blue light from the first light-emitting layer. An optical distance between the reflection electrode and the first light-emitting layer is a distance of constructive interference for the light of the first light-emitting layer.

A display apparatus according to another aspect of the present disclosure includes a plurality of organic EL devices; at least blue, green, and red color filters disposed on light extraction sides of the organic EL devices; and a switching device connected to each of the organic EL devices. Each of the organic EL devices is the above organic EL device according to an aspect of the present disclosure.

Further features of the present disclosure will become apparent from the following description of exemplary embodiments with reference to the attached drawings.

DESCRIPTION OF THE EMBODIMENTS

Figure 1:
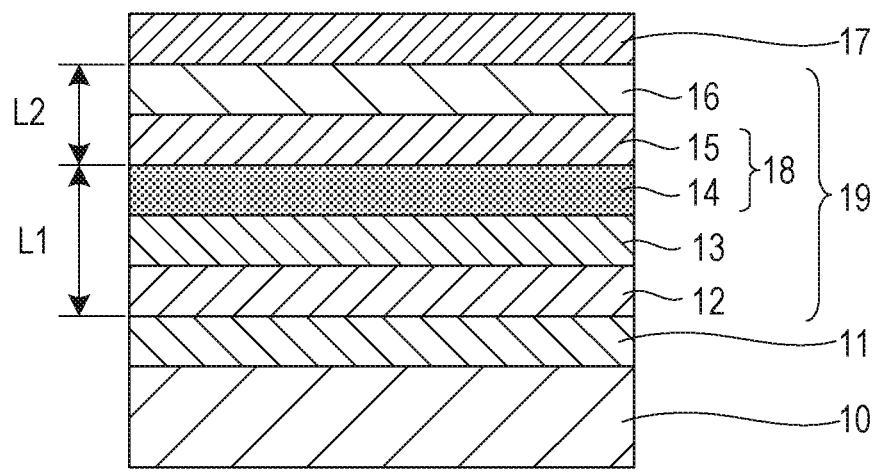
FIG. 1 is a schematic sectional view illustrating an organic EL device according to an embodiment of the present disclosure.

An organic EL device according to an embodiment of the present disclosure is a top emission organic EL device. The organic EL device can emit white light by mixing three emission colors of blue, green, and red. The organic EL device includes a cathode disposed on the substrate side, and a light-emitting layer closest to the cathode is a hole transporting blue-light-emitting layer. The hole transporting light-emitting layer may also be referred to as an electron trapping light-emitting layer.

Hereafter, embodiments will be described with reference to the attached drawings. The dimensions of each component in the drawings are different from those of actual components. In this specification, a well-known or publicly-known technique in this technical field is applied to parts not particularly drawn or described.

FIG. 1 is a schematic sectional view according to an embodiment of the present disclosure. In FIG. 1, two light-emitting layers, namely, a red/green-light-emitting layer 15 containing a red-light-emitting dopant and a green-light-emitting dopant and a blue-light-emitting layer 14 containing a blue-light-emitting dopant are stacked on a substrate 10 to form a white-light-emitting layer 18. The blue-light-emitting layer is also described as a first light-emitting layer. The red/green-light-emitting layer is also described as a second light-emitting layer. An optical distance between the reflection electrode and the first light-emitting layer can be a distance of constructive interference for the light of the first light-emitting layer. An optical distance between the second light-emitting layer and the reflection electrode can be a distance of constructive interference for the light of the second light-emitting layer.

In this embodiment, a reflection electrode 11 is disposed on the substrate 10 as a cathode. The substrate 10 used may be formed of glass or resin. When a display apparatus or a lighting apparatus is produced, for example, a switching device (not illustrated) such as a TFT and a converter circuit (not illustrated) are connected to the reflection electrode 11.

The reflection electrode 11 may be formed of a reflective metal such as Al, Ag, Ti, or Cr, an alloy of the foregoing, TiN, or the like. Alternatively, a transparent metal oxide such as ITO may be stacked.

An electron injection layer 12 can be formed on the reflection electrode 11 to improve the electron injection properties. The electron injection layer 12 may be formed of a mixture of an electron donating dopant and an electron transporting organic compound. The electron injection layer 12 may also contain an imidazolidene derivative or a carbene compound. The electron donating dopant may be an alkali metal, an alkaline-earth metal, a rare-earth metal, or a compound of the foregoing. The electron injection layer 12 may be formed by adding an alkali metal compound to an electron transporting material. The alkali metal compound is preferably a cesium compound and more preferably cesium carbonate.

In the present disclosure, the electron injection layer 12 is suitably formed by codeposition of cesium carbonate and an electron transporting organic compound. The electron transporting organic compound is a known compound such as a phenanthroline compound. During the codeposition, cesium suboxide derived from cesium carbonate, such as ($Cs_{11}O_3$) $Cs_{10}$, ($Cs_{11}O_3$)Cs, or $Cs_{11}O_3$ may be formed in the electron injection layer 12 as a result of, for example, decomposition of cesium carbonate. A coordination compound may also be formed between cesium and an organic compound. Therefore, the electron injection layer 12 may contain cesium suboxide and a cesium coordination organic compound in addition to cesium carbonate. The amount of cesium carbonate added during the codeposition of the cesium carbonate and the organic compound is particularly 1 to 10 wt %.

The electron injection layer 12 particularly has a thickness of 10 nm or less. When the thickness is 10 nm or less, flow of electric current between the reflection electrodes can be suppressed.

The electric current flow between the reflection electrodes may also be referred to as a leakage current.

In the case where the electron injection layer 12 is not formed, the reflection electrode 11 desirably has electron injection properties. The electron injecting material can be obtained by adding an alkali metal, an alkaline-earth metal, or a compound of the foregoing to a reflective metal. The reflection electrode 11 is preferably formed of cesium carbonate and is more preferably formed by codeposition of Ag and cesium carbonate. The amount of cesium carbonate added is particularly 1 to 10 wt %.

An electron transport layer 13 may be formed on the electron injection layer 12. The electron transport layer 12 may be formed of a known electron transporting organic compound such as a phenanthroline compound. The electron transporting organic compound may be the same as or different from the electron transporting organic compound used for the electron injection layer 11.

A blue-light-emitting layer 14 is formed on the electron transport layer 13, but a hole blocking layer (not illustrated) may be interposed between the electron transport layer 13 and the blue-light-emitting layer 14.

The blue-light-emitting layer 14 contains a host material (hereafter referred to as a "first host material") and a blue-light-emitting dopant. When the first host material has a LUMO energy level Lh and a HOMO energy level Hh and the blue-light-emitting dopant material has a LUMO energy level Ld and a HOMO energy level Hd, the formula (a) below is satisfied. The host material is also described as a first organic compound. The blue-light-emitting dopant is also described as a second organic compound.

$$|Ld|>|Lh| \text{ and } |Hd|>|Hh| \tag{a}$$

The LUMO energy level and the HOMO energy level have negative values with respect to the vacuum level in the case of typical molecules. In the present disclosure, the energy levels are expressed in the form of an absolute value.

In the present disclosure, the HOMO energy level is measured with a Surface Analyzer ("AC-2" manufactured by RIKEN KEIKI Co., Ltd.). The LUMO energy level is determined from the HOMO energy level and a band gap determined from the absorption edge in a visible-ultraviolet absorption spectrum. That is, the LUMO energy level is the sum of the HOMO energy level and the band gap.

Figure 2:
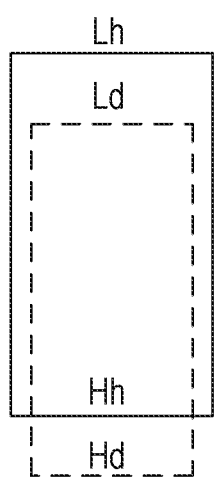
FIG. 2 illustrates an energy band of a blue-light-emitting layer in the organic EL device according to an embodiment of the present disclosure.

FIG. 2 illustrates an energy band of the blue-light-emitting layer 14 in the organic EL device according to an embodiment of the present disclosure. When electrons are injected into the blue-light-emitting layer 14 that satisfies the above formula (a), the electrons are trapped at the LUMO energy level of the blue-light-emitting dopant. However, the content of the blue-light-emitting dopant in the blue-light-emitting layer 14 is as low as 10 wt % or less, and thus the electrons do not easily conduct. The content of the blue-light-emitting dopant in the blue-light-emitting layer 14 is particularly 0.1 wt % or more. The weight percentage of the blue-light-emitting dopant is a weight percentage obtained when the total weight of the host material and the blue-light-emitting dopant in the blue-light-emitting layer is assumed to be 100 wt %.

When holes are injected, the holes are injected into the HOMO energy level of the first host material. Since the host material constitutes the majority of the blue-light-emitting layer 14 on a volume basis, the holes conduct at this level. Therefore, the blue-light-emitting layer 14 is a hole transporting layer in which holes easily conduct than electrons. Since holes are not trapped inside the hole transporting blue-light-emitting layer 14, the material does not easily undergo oxidation degradation even when emission is continuously performed. The blue-light-emitting layer 14 has high driving durability.

On the other hand, since the blue-light-emitting layer 14 has electron trapping properties, the blue-light-emitting layer 14 theoretically tends to undergo reduction degradation. However, an organic material for the organic compound layer 19 is hardly detected as a degraded substance that has been actually reduced. Thus, it is believed that reduction degradation of the organic material does not easily occur compared with oxidation degradation.

In the present disclosure, the reflection electrode 11 formed on the substrate 10 is used as a cathode. Therefore, electrons can be injected when the blue-light-emitting layer 14 is disposed closest to the substrate 10. A red/green-light-emitting layer 15 is formed on the blue-light-emitting layer 14. In this structure, the optical distance from the reflection surface of the reflection electrode 11 to a light extraction surface of the blue-light-emitting layer 14 can be set to λB/4 (λB: blue light emission wavelength) to produce the interference effect of blue light emission. At the same time, the optical distance from the reflection surface of the reflection electrode 11 to a light extraction surface of the red/green-light-emitting layer 15 is not excessively short because the blue-light-emitting layer 14 is interposed therebetween, and thus the interference effects of red and green light emission can be produced. That is, since red light and green light have a larger light emission wavelength than blue light, a value of λ/4 is larger in red light and green light than in blue light. Thus, by forming the red/green-light-emitting layer 15 on the blue-light-emitting layer 14, the interference effects of both the blue light emission and the red and green light emission can be produced. Concretely, when a wavelength of the light from the first light-emitting layer is $\lambda_B$, the distance of constructive interference for the light of the first light-emitting layer can be represented by $\lambda_2/4 \pm \lambda_B/8$. When a wavelength of the light from the second light-emitting layer is $\lambda_O$, the distance of constructive interference for the light of the second light-emitting layer is represented by $3\lambda_O/4 \pm \lambda_O/8$.

In the present disclosure, the anode serves as a light extraction electrode 17 and thus a layer between the anode and the white-light-emitting layer 18 has hole transporting properties. Compared with a typical case where such a layer has electron transporting properties, a voltage required when the thickness from the white-light-emitting layer 18 to the light extraction electrode 17 is increased can be reduced. This is because the mobility of the hole transporting material typically used in organic EL devices is higher than that of the electron transporting material.

In the present disclosure, the first host material for the blue-light-emitting layer 14 is suitably, for example, a pyrene derivative. A fused ring compound is also used. Examples of the first organic compound include fluorene derivatives, naphthalene derivatives, anthracene derivatives, pyrene derivatives, carbazole derivatives, quinoxaline derivatives, quinoline derivatives, organoaluminum complexes such as tris(8-quinolinolato)aluminum, organozinc complexes, and triphenylamine derivatives.

The second organic compound is suitably, for example, a fluoranthene derivative that is a material satisfying the above formula (a).

In the present disclosure, the optical distance from the reflection surface of the reflection electrode 11 to a light extraction surface of the blue-light-emitting layer 14 is particularly adjusted to about λB/4 (λB: blue light emission wavelength). In the present disclosure, blue light refers to light having a peak wavelength of 430 nm to 480 nm in the emission spectrum. Red light refers to light having a peak wavelength of 580 nm to 680 nm in the emission spectrum. Green light refers light having a peak wavelength of 500 nm to 570 nm in the emission spectrum.

The optical distance λB/4 is accurately represented by $(\lambda B/4) \times (2-(\phi/\pi))$ in consideration of the phase shift φ in the reflection electrode 11. Furthermore, considering that the refractive index of the organic material from the reflection surface of the reflection electrode 11 to a light extraction surface of the blue-light-emitting layer 14 is about 1.8, the actual thickness L1 is about 60 nm.

The red/green-light-emitting layer 15 is stacked on the blue-light-emitting layer 14. The red/green-light-emitting layer 15 in FIG. 1 is a light-emitting layer containing both a green-light-emitting dopant and a red-light-emitting dopant in a second host material, but a green-light-emitting layer and a red-light-emitting layer may be separately formed in a stacked manner. When the green-light-emitting layer and the red-light-emitting layer are separately formed in a stacked manner, the green-light-emitting layer and the red-light-emitting layer are particularly stacked on the blue-light-emitting layer 14 in this order because the interference effect is easily produced. The second host material may be the same as or different from the first host material.

The second host material is suitably the same as the first host material, such as a pyrene derivative. Known dopants are used as the green-light-emitting dopant and the red-light-emitting dopant.

A hole transport layer 16 is formed on the red/green-light-emitting layer 15, but an electron blocking layer (not illustrated) may be interposed between the red/green-light-emitting layer 15 and the hole transport layer 16. The hole transport layer 16 may be formed of a known hole transporting material such as an arylamine derivative.

A light extraction electrode 17 is formed on the hole transport layer 16 as an anode, but a hole injection layer (not illustrated) may be interposed between the hole transport layer 16 and the light extraction electrode 17. The light extraction electrode 17 is particularly a semitransparent metal thin film having both some reflectivity and transparency, such as Ag or a Ag alloy. A metal thin film can be used because the chromaticity can be adjusted by controlling the interference.

In the present disclosure, the thickness from a light extraction surface of the light-emitting layer located closest to the substrate 10, that is, the blue-light-emitting layer 14 to the reflection surface (the surface closer to the substrate 10) of the light extraction electrode 17 is defined as L2.

In the present disclosure, as described above, the thickness from the reflection surface of the reflection electrode 11 formed on the substrate 10 to the light extraction surface of the blue-light-emitting layer 14 is defined as L1. To produce the interference effect of blue light emission, L1 can be adjusted so that the optical distance is about λB/4.

In the present disclosure, L1×2<L2 is particularly satisfied because short circuits and leakage can be suppressed.

To control the chromaticity of extracted light, L2 is more preferably adjusted to about ¾ times the wavelength λ at which an interference effect is desirably produced. Since the blue to green emission peak wavelength is 430 nm to 570 nm and the refractive index of the organic material is about 1.8, L2 is preferably adjusted to about 180 nm to 240 nm. If L2×1.8 is adjusted to ¼ times the wavelength λ, the thickness is excessively decreased and short circuits and leakage tend to unfavorably occur. Concretely, an optical distance between the first light-emitting layer and the light extraction electrode can be represented by $3\lambda_B/4 \pm \lambda_B/8$.

To adjust the thickness L2 to 180 nm to 240 nm, the thickness of the hole transport layer 16 can be increased, but not the thickness of the red/green-light-emitting layer 15. Herein, the thickness of the hole transport layer 16 needs to be adjusted to about 170 nm to 200 nm. In the present disclosure, the organic compound layer on the light extraction side is not an electron transporting layer, but is a hole transporting layer having a relatively high mobility. Thus, even if the thickness is increased, an increase in voltage can be suppressed.

Furthermore, a protective layer (not illustrated) formed of SiN or the like may be optionally disposed on a light extraction surface of the light extraction electrode 16.

Figure 3A:
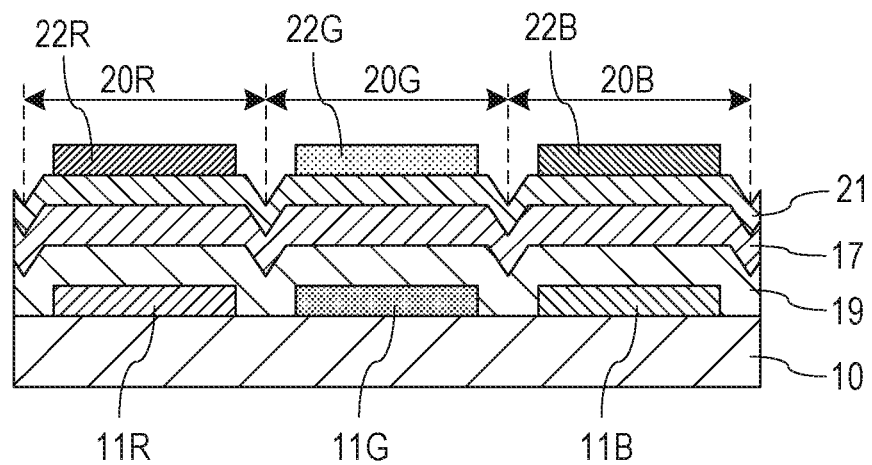
FIGS. 3A and 3B are schematic sectional views each illustrating a display apparatus according to an embodiment of the present disclosure.
Figure 3B:
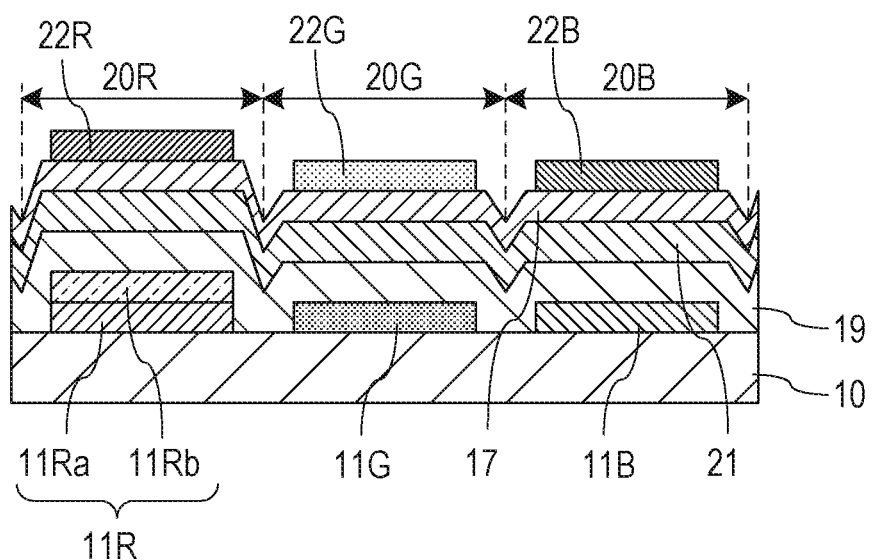

Next, a display apparatus including the organic EL device according to an embodiment of the present disclosure will be described with reference to FIGS. 3A and 3B. FIGS. 3A and 3B are schematic sectional views illustrating a display apparatus according to an embodiment of the present disclosure. The display apparatus according to an embodiment of the present disclosure includes a plurality of the white organic EL devices according to an embodiment of the present disclosure, at least blue, green, and red color filters, and a switching device connected to each of the organic EL devices. FIGS. 3A and 3B each illustrate a single repeating unit including red, green, and blue pixels.

In the display apparatus illustrated in FIG. 3A, reflection electrodes 11R, 11G, and 11B respectively corresponding to the red, green, and blue color filters are disposed on a substrate 10. To control the emitted luminance, a switching device (not illustrated) such as a TFT is connected to each of the plurality of reflection electrodes 11R, 11G, and 11B. The organic compound layer 19 and the light extraction electrode 17 illustrated in FIG. 1 are disposed in a shared manner on the reflection electrodes 11R, 11G, and 11B so as to cross the plurality of reflection electrodes 11R, 11G, and 11B.

A protective layer 21 formed of SiN or the like may be formed on the light extraction electrode 17. A red color filter 22R, a green color filter 22G, and a blue color filter 22B each corresponding to a pixel are disposed on the protective layer 21 to form at least a red pixel 20R, a green pixel 20G, and a blue pixel 20B.

The color filters 22R, 22G, and 22B can be formed by a method in which color filters 22R, 22G, and 22B each having a size of a pixel are disposed on another substrate, and the other substrate may be bonded to the substrate 10 on which the organic EL devices have been disposed.

Alternatively, as illustrated in FIGS. 3A and 3B, color filters 22R, 22G, and 22B may be patterned on the protective layer 21 by photolithography.

In FIG. 3A, the reflection electrodes 11R, 11G, and 11B have the same configuration in the red pixel 20R, the green pixel 20G, and the blue pixel 20B, respectively. However, the configuration may be changed in each pixel to produce a better interference effect of the light-emitting layer. Specifically, as illustrated in FIG. 3B, the reflection electrodes 11B and 11G in the blue pixel 20B and the green pixel 20G are formed of a light-reflective metal, and the reflection electrode 11R in the red pixel 20R is a stack of a light-reflective metal layer 11Ra and a transparent metal oxide layer 11Rb. In this configuration, the optical distance from the reflection surface (the upper surface of the metal layer 11Ra) of the reflection electrode 11R to the upper surface of the red/green-light-emitting layer (not illustrated) is larger than the optical distance from the reflection surface of the reflection electrode 11G to the upper surface of the red/green-light-emitting layer because the transparent metal oxide layer 11Rb is interposed. Thus, the interference effect of green light emission and the interference effect of red light emission are easily produced at the same time.

The display apparatus can be used as an image display apparatus such as monitors of televisions and smartphones and viewfinders of cameras.

The lighting apparatus includes the organic EL device according to an embodiment of the present disclosure and a converter circuit. The lighting apparatus may emit white light, neutral white light, and any other light such as blue light to red light. The converter circuit is a circuit configured to convert alternating voltage into direct voltage. The white light is light having a color temperature of 4200 K and the neutral white light is light having a color temperature of 5000 K. The lighting apparatus may include a color filter.

EXAMPLES

Hereafter, the organic EL device according to an embodiment of the present disclosure will be described. Materials and device constitutions used in Examples are desired examples, but the present disclosure is not limited thereto.

Example 1

A Ti layer (thickness 200 nm) was formed on a glass substrate as a reflection electrode, and UV/ozone cleaning was performed. The glass substrate was then attached to a vacuum deposition apparatus (manufactured by ULVAC, Inc.), and air was evacuated to $1\times10^{-6}$ Torr. A co-deposited layer of cesium carbonate (3 vol %) and a phenanthroline derivative represented by structural formula (1) below was then formed on the reflection electrode as an electron injection layer so as to have a thickness of 7 nm. A layer formed of only the phenanthroline derivative represented by the structural formula (1) below was then formed as an electron transport layer so as to have a thickness of 35 nm.

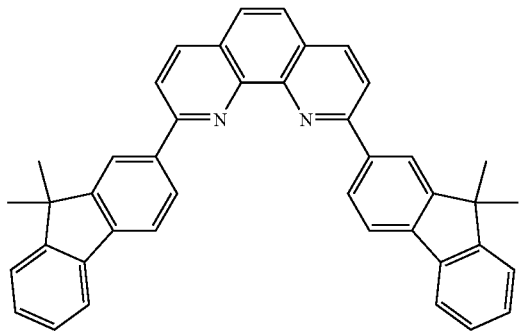

Structural formula (1)

Subsequently, a pyrene derivative represented by structural formula (2) below and serving as a first host material and a fluoranthene derivative represented by structural formula (3) below and serving as a blue-light-emitting dopant were mixed with each other so that the fluoranthene derivative content was 1 vol %, and a blue-light-emitting layer was formed so as to have a thickness of 15 nm. The pyrene derivative has a LUMO energy level Lh of 2.78 eV and a HOMO energy level Hh of 5.72 eV. The fluoranthene derivative has a LUMO energy level Ld of 3.06 eV and a HOMO energy level Hd of 5.85 eV. Therefore, the formula (a), |Ld|>|Lh| and |Hd|>|Hh|, is satisfied. The fluoranthene derivative has an emission peak wavelength of 440 nm.

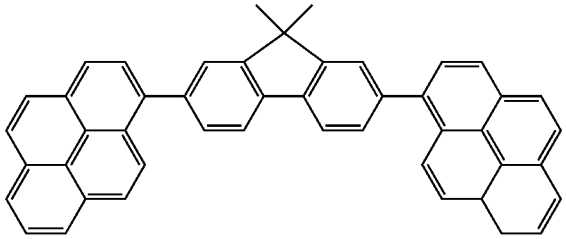

Structural formula (2)

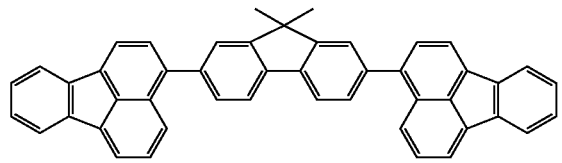

Structural formula (3)

Subsequently, a red/green-light-emitting layer containing both a green-light-emitting dopant and a red-light-emitting dopant was formed on the blue-light-emitting layer so as to have a thickness of 15 nm. Herein, the pyrene derivative represented by the above structural formula (2) was used as a second host material. The green-light-emitting dopant was an anthracene derivative (4 vol %) represented by structural formula (4) below, and the red-light-emitting dopant was a perylene derivative (0.5 vol %) represented by structural formula (5) below.

Structural formula (4)

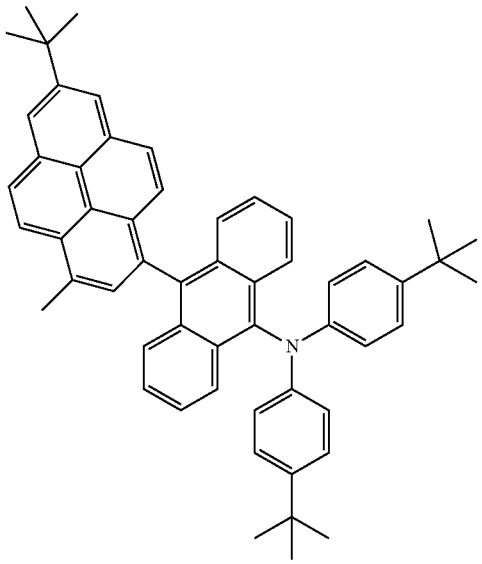

Structural formula (5)

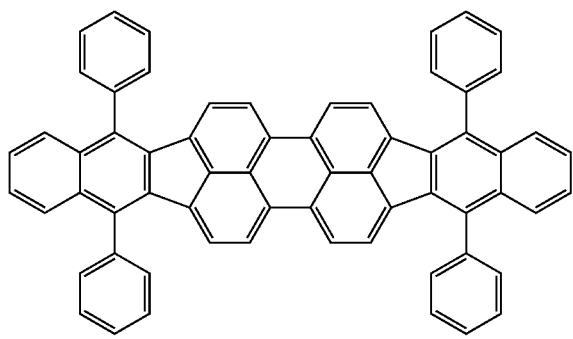

Subsequently, a hole transport layer formed of N,N'-α-dinaphthylbenzidine was formed so as to have a thickness of 200 nm. A hole injection layer formed of an azatriphenylene derivative represented by structural formula (6) below was then formed so as to have a thickness of 10 nm.

Structural formula (6)

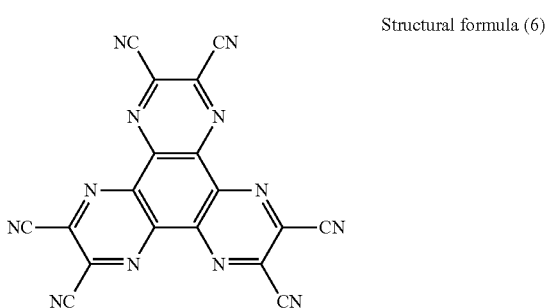 [SMILES: N#Cc1nc2c3nc(C#N)c(C#N)nc3c3nc(C#N)c(C#N)nc3c2nc1C#N]

Furthermore, a light extraction electrode formed of Ag was formed by vapor deposition so as to have a thickness of 10 nm.

In the above structure, the thickness L1 from the reflection surface of the reflection electrode to the light extraction surface of the blue-light-emitting layer is 57 nm. When the refractive index of the organic material is assumed to be 1.8, the optical distance is 103 nm, which is 412 nm×¼. Thus, the conditions in which the interference effect of blue light emission is produced are satisfied. The thickness from the reflection surface of the reflection electrode to the light extraction surface of the red/green-light-emitting layer is 72 nm and the optical distance is 130 nm, which is 520 nm×¼. Thus, the conditions in which the interference effect of green light emission is produced are also satisfied.

Furthermore, the thickness L2 from the light extraction surface of the blue-light-emitting layer to the reflection surface of the light extraction electrode is 225 nm. Since the thickness L1 is 57 nm, the thicknesses L1 and L2 satisfy L1×2<L2, which is a desired condition according to an embodiment of the present disclosure.

When the refractive index of the organic material is assumed to be 1.8, the optical distance corresponding to the thickness L2 is 405 nm, which is 540 nm×¾. Thus, the interference effect of green light emission is produced.

Subsequently, the above substrate was vacuum-transferred to a plasma chemical vapor deposition (CVD) apparatus (manufactured by ULVAC, Inc.), and a protective layer formed of SiN was formed so as to have a thickness of 2 µm. Thus, a white organic EL device was obtained.

A voltage application device (not illustrated) was connected to the obtained white organic EL device. The characteristics of the white organic EL device were evaluated using the reflection electrode 11 as a cathode and the light extraction electrode 17 as an anode. The current-voltage characteristic was measured with a microammeter "4140B" manufactured by Hewlett-Packard Company. The chromaticity was evaluated with "SR-3" manufactured by TOPCON Corporation. The emitted luminance was measured with "BM7" manufactured by TOPCON Corporation.

As a result, the efficiency, the voltage, and the CIE chromaticity coordinates during display at 1000 cd/m$^2$ were 7.2 cd/A, 3.1 V, and (0.36, 0.36), respectively, which were good characteristics.

A continuous driving test at an initial luminance of 4000 cd/m$^2$ was also performed. The half-life of luminance was 3000 hours, which indicated high durability.

Example 2

A white organic EL device was produced in the same manner as in Example 1, except that the reflection electrode 11 was formed by depositing Ag and cesium carbonate (3 vol %) so as to have a thickness of 200 nm, the electron injection layer 12 was not disposed, and the thickness of the electron transport layer 13 was changed to 42 nm.

The produced white organic EL device was evaluated in the same manner as in Example 1. The same results as those in Example 1 were obtained, except that the voltage during display at 1000 cd/m$^2$ was increased to 3.4 V.

Comparative Example 1

A white organic EL device was produced in the same manner as in Example 1, except that the hole injection layer, the hole transport layer, the red/green-light-emitting layer, the blue-light-emitting layer, the electron transport layer, and the electron injection layer were formed in this order from the substrate 10 in the formation of the organic compound layer. Herein, the thickness of the hole injection layer was changed to 7 nm, the thickness of the hole transport layer was changed to 35 nm, the thickness of the electron transport layer was changed to 200 nm, and the thickness of the electron injection layer was changed to 10 nm so that the thicknesses L1 and L2 were the same as those in Example 1.

The characteristics of the produced white organic EL device were evaluated in the same manner as in Example 1, except that the reflection electrode 11 was used as an anode and the light extraction electrode 17 was used as a cathode. As a result, the efficiency, the voltage, and the CIE chromaticity coordinates during display at 1000 cd/m² were 6.1 cd/A, 4.9 V, and (0.35, 0.36), respectively. In this device, the voltage was considerably increased.

In Comparative Example 1, the distance from the substrate-side surface of the red/green-light-emitting layer to the reflection surface of the light extraction electrode is 240 nm and thus the optical distance is 432 nm, which is 576 nm×¾. Therefore, the interference effects of red light emission and green light emission are produced. However, the large thickness of the electron transport layer causes an increase in the light-emitting voltage compared with Examples 1 and 2.

Furthermore, a continuous driving test at an initial luminance of 4000 cd/m² was performed. However, the emitted luminance was decreased with a rapid voltage increase when 20 hours passed. This may be because, unlike the devices in Examples 1 and 2, the large thickness of the electron transport layer caused an increase in voltage, which increased the temperature in the continuous driving test.

In the present disclosure, by disposing the hole transporting blue-light-emitting layer on the cathode side, high durability is achieved. By disposing the cathode on the substrate side, good interference effects of blue light emission and red/green light emission can be produced while short circuits and leakage are suppressed, and thus the light-emitting voltage of the white organic EL device can be decreased. Furthermore, since a portion from the light-emitting layer to the anode on the light extraction side has hole transporting properties, the light-emitting voltage can be decreased. Therefore, even in the case where the hole injection layer or the hole transport layer that serves as an upper surface when the anode on the light extraction side is formed is damaged, the light-emitting voltage can be decreased on the whole, which can suppress the power consumption and improve the durability. Accordingly, a display apparatus and a lighting apparatus with low power consumption and high durability can be provided.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2016-230807 filed Nov. 29, 2016 and No. 2017-214421 filed Nov. 7, 2017, which are hereby incorporated by reference herein in their entirety.

What is claimed is:

1. An organic EL device comprising, in the following order:
   a substrate;
   a reflection electrode;
   an organic compound layer; and
   a light extraction electrode,
   wherein the reflection electrode serves as a cathode and the light extraction electrode serves as an anode,
   wherein the organic compound layer includes a first light-emitting layer which is electron trapping type and a second light-emitting layer disposed between the first light-emitting layer and the light extraction electrode,
   wherein the first light-emitting layer emits blue light,
   wherein the second light-emitting layer emits light whose wavelength is longer than a wavelength of the blue light from the first light-emitting layer, and
   wherein an optical distance between the reflection electrode and the first light-emitting layer is a distance of constructive interference for the light of the first light-emitting layer.

2. The organic EL device according to claim 1,
   wherein the first light-emitting layer includes a first organic compound and a second organic compound, and
   wherein when the first organic compound has a LUMO energy level Lh and a HOMO energy level Hh and the second organic compound has a LUMO energy level Ld and a HOMO energy level Hd, |Ld|>|Lh| and |Hd|>|Hh| are satisfied.

3. The organic EL device according to claim 1,
   wherein the light extraction electrode is a semitransparent metal thin film, and
   wherein when L1 represents a distance from a reflection surface of the reflection electrode to a light extraction surface of the blue-light-emitting layer and L2 represents a distance from the light extraction surface of the blue-light-emitting layer to a reflection surface of the light extraction electrode, L1×2<L2 is satisfied.

4. The organic EL device according to claim 1,
   wherein an optical distance between the second light-emitting layer and the reflection electrode is a distance of constructive interference for the light of the second light-emitting layer.

5. The organic EL device according to claim 1,
   wherein when a wavelength of the light from the first light-emitting layer is $\lambda_B$, the distance of constructive interference for the light of the first light-emitting layer is represented by $\lambda_B/4 \pm \lambda/8$.

6. The organic EL device according to claim 3,
   wherein when a wavelength of the light from the second light-emitting layer is $\lambda_O$, the distance of constructive interference for the light of the second light-emitting layer is represented by $3\lambda_O/4 \pm \lambda_O/8$.

7. The organic EL device according to claim 1,
   wherein the organic compound layer comprises an electron injection layer containing at least cesium carbonate and an organic compound, the electron injection layer being in contact with the reflection electrode.

8. The organic EL device according to claim 7,
   wherein the electron injection layer contains at least one of cesium suboxide and a cesium coordination organic compound.

9. The organic EL device according to claim 7,
   wherein the electron injection layer has a thickness of 10 nm or less.

10. The organic EL device according to claim 1,
    wherein the reflection electrode contains cesium carbonate.

11. The organic EL device according to claim 2,
    wherein the second organic compound comprises a fluoranthene derivative.

12. The organic EL device according to claim 2,
    wherein the first organic compound is selected from the group consisting of fluorene derivatives, naphthalene derivatives, anthracene derivatives, pyrene derivatives, carbazole derivatives, quinoxaline derivatives, quinoline derivatives, organoaluminum complexes, organozinc complexes, and triphenylamine derivatives.

13. The organic EL device according to claim 3, wherein an optical distance between the first light-emitting layer and the light extraction electrode is represented by $3\lambda_B/4 \pm \lambda_B/8$.

14. The organic EL device according to claim 1, wherein a distance between the reflection electrode and the first light-emitting layer is 60 nm.

15. The organic EL device according to claim 1, wherein a distance between the light extraction electrode and the first light-emitting layer is within a range from 180 nm to 240 nm.

16. The organic EL device according to claim 1, wherein the second light-emitting layer includes a green-light-emitting material and a red-light-emitting material.

17. The organic EL device according to claim 1, wherein the organic EL device comprises devices corresponding to blue, green, and red color filters, wherein the reflection electrode of the organic EL device corresponding to the red color filter comprises a light-reflective metal layer and a transparent metal oxide layer disposed between the light-reflective metal layer and the light-emitting layer.

18. A display apparatus comprising:
a plurality of organic EL devices;
blue, green, and red color filters disposed at light extraction sides of the organic EL devices; and
a switching device connected to each of the organic EL devices,
wherein one of the organic EL devices is the organic EL device according to claim 1.

19. The display apparatus according to claim 18, wherein the reflection electrodes of the organic EL devices corresponding to the blue and green color filters are formed of a light-reflective metal, and
the reflection electrode of the organic EL device corresponding to the red color filter includes a light-reflective metal layer and a transparent metal oxide layer disposed on a light extraction side of the metal layer.

20. A lighting apparatus comprising:
the organic EL device according to claim 1; and
a converter circuit.

* * * * *